United States Patent [19]

Yoshikawa et al.

[11] 4,232,512
[45] Nov. 11, 1980

[54] SOLID STATE WATCH MODULE CONSTRUCTION

[75] Inventors: Kenichi Yoshikawa, Tokyo; Makoto Koshikawa, Higashimurayama; Toshio Umemoto, Koganei; Tetsuo Satoh, Higashiyamato; Singo Ichikawa, Sayama; Yoshiaki Kato, Higashimurayama, all of Japan

[73] Assignee: Citizen Watch Co., Ltd., Tokyo, Japan

[21] Appl. No.: 863,536

[22] Filed: Dec. 22, 1977

[30] Foreign Application Priority Data

Dec. 27, 1976 [JP] Japan ................................ 51/157787
Dec. 27, 1976 [JP] Japan ................................ 51/157795

[51] Int. Cl.² ........................ G04C 3/00; G04B 19/30; G04B 37/00
[52] U.S. Cl. ...................................... 368/82; 368/276
[58] Field of Search ............... 58/23 R, 23 BA, 35 W, 58/50 R, 88 R, 9 B; 361/400, 397, 398, 402, 408

[56] References Cited

U.S. PATENT DOCUMENTS

| 3,759,031 | 9/1973 | McCullough et al. | 58/50 R |
| 3,863,436 | 2/1975 | Schwarzschild et al. | 58/50 R |
| 3,983,689 | 10/1976 | Burke et al. | 58/50 R |
| 4,023,344 | 5/1977 | Mukaiyama | 58/35 W |
| 4,038,814 | 8/1977 | Niida | 58/23 R |
| 4,042,861 | 8/1977 | Yasuda et al. | 361/400 |
| 4,051,663 | 10/1977 | Chihara et al. | 58/20 R |
| 4,064,689 | 12/1977 | Yasuda et al. | 58/50 R |
| 4,086,752 | 5/1978 | Kishimoto | 38/23 R |

Primary Examiner—Vit W. Miska

[57] ABSTRACT

A solid state watch module construction including a plastic substrate and an electro-optical display cell directly mounted on the substrate. The substrate has an integrated circuit chip on one side thereof, and a plurality of printed circuit leads connected to electrical terminals of the integrated circuit chip. The electro-optical display cell has a plurality of electric terminals formed in rows in alignment with terminal ends of said printed circuit leads. The electro-optical display cell is bonded to the one side of the substrate and the electric terminals of the display cell are bonded to the terminal ends of the printed circuit leads.

12 Claims, 10 Drawing Figures

SOLID STATE WATCH MODULE CONSTRUCTION

This invention relates to watch module constructions for a miniature electronic device such as an electronic timepiece and, more particularly, to a watch module construction for a digital electronic timepiece.

In the past, the widest used techniques for mounting IC chips were the wire bonding and mini-MOD processes. According to the wire bonding process, wires were driven individually into a substrate and required a multiplicity of pins and a large number of production steps. In addition, it was necessary for the wires to be rather long, a drawback which required a fairly large area around the periphery of the IC chip and which limited mounting density including even the distribution of the wiring pattern was encountered. Moreover, the wires were susceptable to breakage through thermal shock which depended on the environmental conditions, and permitted moisture to penetrate into the device. In the mini-MOD process, on the other hand, the IC chip was directly bonded onto an electrically conductive foil disposed on a flexible film carrier. This speeded up processing but required the formation of a gold bump on the chip terminals and the use of expensive polyimide resin as the film carrier. Both of these requirements posed the disadvantage of higher costs.

In conventional watch module constructions for digital electronic timepieces, further, it has been a common practice to mount an electro-optical display cell on a cell supporting frame on one side thereof, support a ceramic substrate on the other side of the cell supporting frame, and dispose electrically conductive rubber members between an IC chip on the ceramic substrate and the display cell to provide electrical connection therebetween. This structure requires the provision of a backing member for fixedly holding the ceramic substrate onto the cell supporting frame. Further, a remarkable space is necessarily provided between the display cell and the ceramic substrate, and, therefore, it is difficult to reduce the thickness of the module. Another drawback is encountered in that the number of components can not be reduced because of inherent construction of the prior art module.

It is, therefore, an object of the present invention to provide a solid state watch module construction which can overcome the shortcomings encountered in prior art.

It is another object of the present invention to provide a solid state watch module construction which is extremely simple in construction, easy to assemble, low in manufacturing cost and highly reliable in operation.

It is another object of the present invention to provide a solid state watch module construction in which a substrate is made of a plastic material formed with printed circuit leads interconnected to an integrated circuit chip and in which an electro-optical display device is directly mounted on the plastic substrate and electric terminals of the display cell is directly bonded to the printed circuit leads on the plastic substrate whereby the number of components is remarkably reduced and ease of assembly is provided.

It is a further object of the present invention to provide a solid state watch module construction employing a plastic substrate which can serve as a back cover.

It is a still further object of the present invention to provide a solid state watch module construction employing a plastic substrate having a display cell supporting portion integrally formed therewith for directly supporting an electro-optical display cell.

It is a still further object of the present invention to provide a solid state watch module construction employing a plastic substrate having printed circuit leads formed by a photochemical process.

These and other objects, features and advantages of the present invention will become more apparent from the following description when taken in conjunction with the accompanying drawings, in which.

Figure 1:
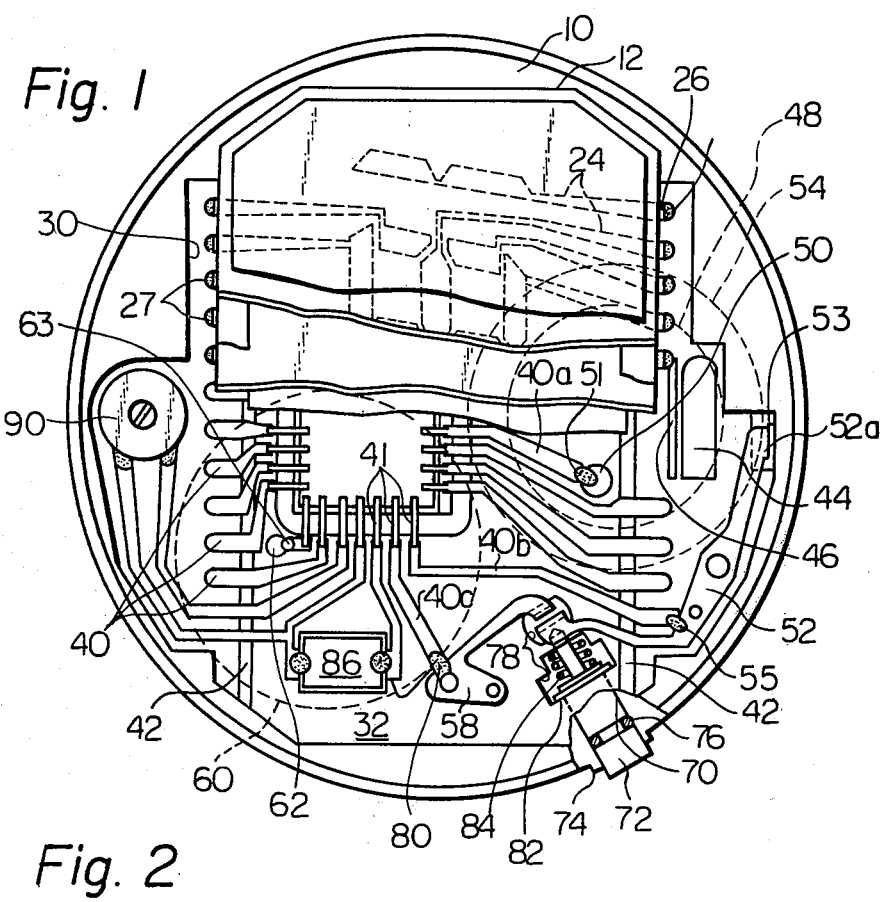
FIG. 1 is a plan view of a preferred embodiment of a solid state watch module construction according to the present invention.
Figure 2:
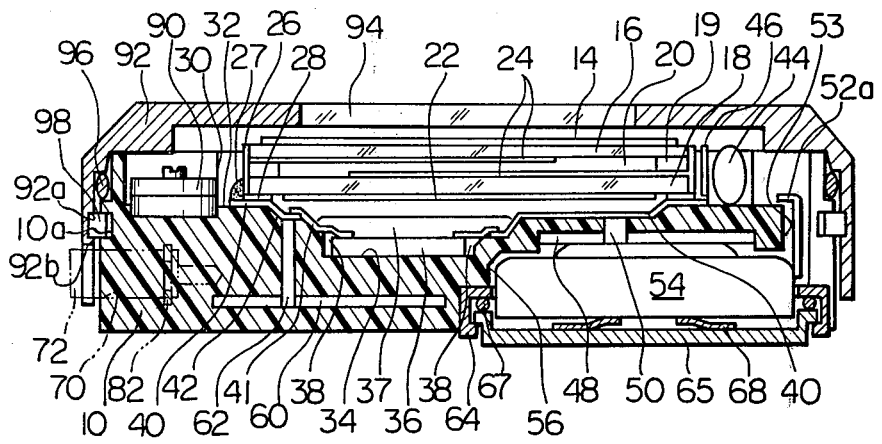
FIG. 2 is a cross sectional view of the watch module construction shown in FIG. 1.

Referring now to FIGS. 1 and 2 of the drawings which show a plan view and a cross sectional view of a solid state watch module construction according to the present invention, the solid state watch module construction generally comprises a plastic circuit board or substrate 10 and an electro-optical display means 12 directly mounted on the plastic substrate 10.

The electro-optical display means 12 may be of any known types suggested in the prior art such as liquid crystal, electrophoretic, electrochromic, etc., having the common characteristic that time indicating characters are made visible by means of electrode patterns in a viewing surface by providing suitable coded drive signals to the display. In the illustrated embodiment of FIGS. 1 and 2, the display means 12 is shown as comprising a liquid crystal display cell composed of a sandwich construction of an upper transparent polarizing layer 14, an upper glass layer 16 carrying thereon the polarizing layer 14, a lower glass plate 18 spaced apart from the upper glass layer 16 by spacers 19 to provide a space therebetween to accommodate therein a liquid crystal material 20 suitable for display, and a lower transparent polarizing layer 22 attached to the lower glass plate 18. Electrode patterns 24 are formed on the inner surfaces of the upper glass plate 16 and the lower glass plate 18, respectively, to define the time indicating characters as is known in the art. The electrode patterns 24 extend toward both sides of the display cell 12 and are connected to rows of side electrode layers 26 formed on both sides of the display cell 12. The liquid crystal display cell 12 thus constructed is directly bonded to the plastic substrate 10 by a bonding layer 28.

The plastic substrate 10 are formed by injection molding a plastic material and serves as a back cover of the watch module construction. The substrate 10 has a first cavity 30 formed on one side thereof for accommodating the display cell 12 as well other components which will be subsequently described. The first cavity 30 has a bottom wall 32 on which a second cavity 34 is formed. An integrated circuit chip 36 adapted to provide coded drive signals for causing the display cell 12 to display time information is placed in the second cavity 34 and secured in place by a bonding agent 38 such that an integrated circuit pattern of the chip faces upward. The integrated circuit chip 36 has a plurality of electric terminals formed in rows along the edge thereof. These electric terminals are connected to a first plurality of printed circuit leads 40 by means of a second plurality of printed circuit leads 41, respectively. The first plurality of printed circuit leads 40 are formed on the radial wall 30 of the first cavity and a stepped wall 42 by an offset concave printing technique and terminate at their ends on the bottom wall 32 in rows which are aligned vertically or axially with the side electrode layers 26 on both sides of the display cell 12. The circuit leads 40 are thus connected to the side electrodes 26 by bonding as at 27. The second plurality of printed circuit leads 41 are formed by a photochemical process as will be described in detail so as to interconnect the electric terminals of the integrated circuit chip 36 and the first plurality of printed circuit leads 40 with one another. Thereafter, a layer 37 of an opaque material such as black epoxy resin is formed on the integrated circuit chip 36 to shield the chip from harmful effects of the photochemical treatment. A lamp 44 is fixed on the bottom wall 32 at a position adjacent the side of the display cell 12 for illuminating the display cell 12 from its side. A deflection plate 46 is also mounted on the bottom wall 32 between the display cell 12 and the lamp 44, to polarize the light which illuminates the display cell 12 from its side; hence, the illumination means can be provided in a thin structure since a so-called light-conductive plate is unnecessary.

The substrate 10 also has a cutout 56 formed on the other side of the substrate, in which a battery 54 is received. A hatch 64 is shown as disposed in the cutout 56 of the substrate 10 but may be integrally formed with the substrate 10. A battery cover 65 is held in place by the hatch 64 to protect the battery 54, and a watertight sealing effect is provided by a sealing ring 67 disposed between the hatch 64 and the battery cover 65. Indicated as 68 is a battery spring which urges the battery 54 toward a battery cathod plate 48 secured to the bottom wall of the cutout 56. The cathode plate 48 is connected to a cathode plate supporting column 50 extending to the one side of the substrate 10 and interconnected to a printed circuit lead 40a by a bonding agent 51. A spring 52 is provided on the bottom wall 32 of the substrate and connected to a printed circuit lead 40b by a bonding agent 55. The spring 52 has an axial extension 52a extending through an axial bore 53 extending toward the cutout 56 of the substrate 10. The axial extension 52a is held in engagement with the battery 54 and serves as a positive terminal of the battery 54. The axial bore 53 may be sealed with a suitable packing material so that the cutout 56 serving as the battery compartment can be completely isolated from the electronic components as well as circuit leads provided in the first and second cavities of the substrate 10 so as to protect these elements from battery leakage as well as from dust and moisture when the battery 54 is replaced. Indicated as 60 is an antenna plate provided in the substrate by some suitable means such as heat caulking or insert molding. The antenna plate 60 is connected to a supporting column 62 protruding toward the first cavity 30 of the bottom wall 32 of the substrate and interconnected to one of the printed circuit leads 40 by a bonding agent 63. The antenna plate 60 is supplied with time unit signals from the integrated circuit chip 36, which time unit signals are detected by an external time measuring device for the correction of time.

As shown in FIG. 1, the substrate 10 also has a radially extending bore 70 in which a switch buttom in the form of a stem 72 is slidably received. A collar 74 is formed on the outer periphery of the substrate 10 in alignment with the radial bore 70 and serves as a positioning means as will be described. Indicated at 76 is a sealing ring to provide a watertight sealing effect. The radial bore 70 communicates with recesses 78 to which an end of the switch button 72 protrudes and is adapted to urge a downward flange portion (no numeral) of the spring 52 toward a counter part of another spring 58 mounted on the bottom wall 32 of the first cavity 30 of the substrate to provide an electrical connection between the springs 52 and 58 when the button 72 is depressed. The spring 58 is connected to a printed circuit lead 40c by a bonding agent 80. The switch button 72 is provided with a snap ring 82 and a spring 84 is provided in the recess 78 to provide a resilient action to the switch button 72. Indicated at 86 is an external component mounted on the bottom wall 32 of the substrate. A trimming capacitor 90 is also mounted on the bottom wall 32 and interconnected to the printed circuit leads.

As shown in FIG. 2, a front case 92 having a crystal glass plate 94 is fixedly secured to the substrate 10 to cover the one side thereof. A watertight seal 96 is disposed between the front case 92 and the substrate 10. Indicated at 98 is a flexible spring plate engaging recesses 92a and 10a of the front case 92 and the substrate 10 respectively, to fixedly hold the front case 92 with respect to the substrate 10. The front case 92 has a bore 92b with which the collor 74 of the substrate 10 engages so that the positioning of the front case 92 relative to the substrate 10 is performed. With the structure mentioned above, the plastic substrate 10 serves as a back cover of the watch module construction and, thus, the number of components can be minimized while making it possible to obtain a compact construction.

A method of forming printed circuit leads 40 will now be described. The printed circuit leads 40 are formed on the one side of the substrate 10, i.e., on the bottom wall 32 and the stepped wall 42 by means of an offset concave printing techniqal (a decalcomania method of transferring an electrically conductive ink by way of an elastomeric body). The printed circuit leads 40 are connected to the IC chip 36 by the printed circuit leads 41 comprising pads (not shown) of external connection terminals formed by an electrochemical process along the edge on the top of the IC chip 36. The printed circuit leads 41 are formed by painting a metallic salt of an organic acid such as a silver glutamate on the stepped surface 42 to form a photosensitive layer (at which time zinc oxide or the like is also employed as a sensitizer), exposing the surface 42 through a mask by means of ultraviolet light so as to deposit silver metal on exposed regions as a desired circuit pattern, immersing the substrate 10 into a mixed solution of sodium hydroxide and ammonium hydroxide to dissolve the unexposed regions of the photosensitive layer while in the exposed regions agglomerate silver metal remains insoluble, and carrying out the electroless plating on the exposed regions by immersion in an appropriate electroless plating bath. Such a process for forming the wiring pattern is referred to as the PCC process.

Although this technique can be used per se in the present invention, the deposited silver itself may be employed as the conductor in a case where the density of free silver is high. Further, after exposing the pattern to light and without removing the non-photosensitive silver salt, it suffices merely to cover the IC chip 36 with an opaque material 37 (as shown in FIG. 2 but omitted from FIG. 1) such as black epoxy resin, the material 37 also serving to protect the chip 36. It is thus possible to shield the chip 36 from the harmful effects of the photo-chemical treatment. If any photoconductive material should come into contact with the side of the chip where the semiconductors are exposed, the leads which have been formed by a photochemical treatment will be short-circuited. However, this can be avoided by providing the outer edge of the chip 36 with a guard ring or by subjecting in to an insulating treatment. Alternatively, the side surfaces of the chip can be coated with the insulating bonding agent 38, as shown in the drawings, or the side surfaces of the chip can be subjected to an insulating treatment after grooves have been formed for the purpose of separating the chip from a wafer, or after the separation itself. The mask used during the formation of the pattern may be printed from a photosensitive film. If a material which is not wet by the photosensitive material is printed as a mask, the photosensitive material will not adhere to the mask so that the pattern can be formed through uniform exposure to light. In a case where the extremely low power consumption is caused by a liquid crystal display device the impedance of the wiring pattern may be relatively high and the above noted PCC process can be suitably employed. At portions which require a low impedance, such as the wiring pattern for an oscillator circuit or a stepping motor, it suffices to increase the size of the pads or widen the leads. The entire wiring pattern on the substrate 10 may also be formed at one time using a photochemical method. Exposure of the recesses and projections to light may be accomplished by using a horizontal mask and parallel beams of light, or by scanning a beam of light and using a vertical mask (a mask produced by printing a light-shielding pattern, corresponding to the recesses and projections, on the surface of a transparent body).

The structure mentioned above allows design changes to be made in the external appearance of an electronic device without undue stress being placed on the module itself, and is extremely effective in lowering costs and enhancing parts management.

According to the invention as described above, the use of photochemical process to form the circuit patterns does not require the utilization of an expensive material for the IC chip or substrate, the simultaneous use of bonding reduces labor and does not require a large area, wiring can be formed even over portions of the substrate that lie on different levels, the strength of the wiring is high since it derives from the strength of the plastic substrate, and various elements can be readily integrated with the wiring patterns. The mounting and wiring method of the invention is thus well suited to the production of miniature watch module constructions. Methods associated with photosensitive materials, sensitizers, developers and light sources when forming circuitry photochemically will not be limited to the illustrated examples. In cases where some of the above-mentioned characteristics are present, other methods will be used. For example, it may be possible to use silver oxide itself as a photosensitive material.

Figure 3:
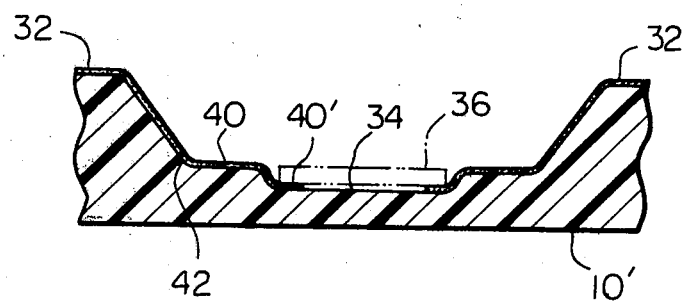
FIG. 3 is a fragmentary cross sectional view of a modified form of a plastic substrate forming part of the watch module construction according to the present invention.
Figure 4:
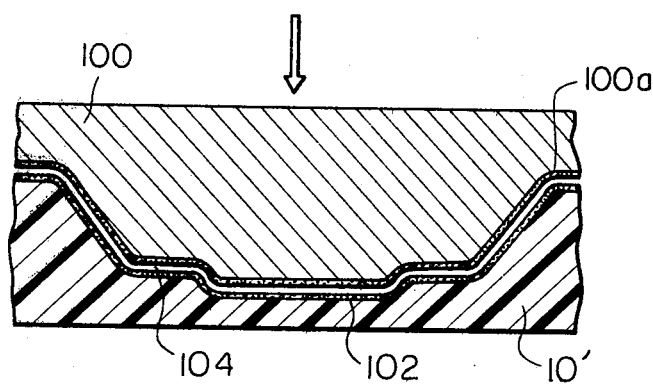
FIG. 4 is a view illustrating a method of forming printed circuit leads on the plastic substrate shown in FIG. 3.

FIG. 3 shows a modified form of the plastic substrate shown in FIGS. 1 and 2. In the modification of FIG. 3, the printed circuit leads 41 are dispensed with and, instead thereof, the printed circuit leads 40 have terminal portions 40' extending toward the bottom wall of the second cavity 34 of the plastic substrate 10'. The terminal portions 40' are arranged in rows along the periphery of the second cavity 34 in the same pattern as that of the second plurality of printed circuit leads 41 shown in FIG. 1 so that the electrical terminals formed along the edge of the integrated circuit chip 36 are readily aligned with and interconnected to the terminal portions 40'. FIG. 4 shows an example of a method of forming the printed circuit leads 40' shown in FIG. 3. In FIG. 4, reference numeral 100 denotes an exposure mask which is made of a transparent and resilient material such as plastic, silicone, polypropylene or the like and has a mating surface 100a complementary in shape to the stepped surface portion of the plastic substrate 10'. The mating surface 100a of the exposure mask 100 has a pattern of cavities or recesses suitable for forming a desired pattern of printed circuit leads 40 on the substrate 10'. An electrically conductive paint or ink is filled in the cavities or recesses of the exposure mask 100 and applied to the stepped surface portion of the substrate 10' in a prescribed pattern by a decalcomania process.

The method of forming the printed circuit leads 40 on the substrate 10' using the mask mentioned above will now be described in more detail. The stepped surface portion including the bottom wall 32, stepped surface 42 and the bottom wall of the cavity 34 is applied with a Cu layer 102 by plating. A photo resist 104 is painted on the Cu layer 102 and subsequently dried. Thereafter, the exposure mask 100 is placed on the substrate 10' such that the mating surface 100a is brought into close contact with the stepped surface portion of the substrate 10'. Next, the substrate 10' is exposed to ultraviolet light from an upper side as shown by an arrow. The substrate 10' is immersed in a developer so that the unexposed regions of the photo resist are dissolved while the exposed regions remain insoluble and, hence, a pattern of photo resist layer 104 is formed on the Cu layer 102. When, next, an Au plating is applied to the stepped surface portion of the substrate 10', an Au layer is deposited on the Cu layer 102 in a desired pattern. The photo resist remaining on the substrate 10' is removed by immersing the substrate 10' in a stripping agent. Lastly, the Cu layer 102 is etched so that a desired pattern of printed circuit leads 40 are finally formed.

The exposure mask 100 may be obtained by producing a die having the same shape as the plastic substrate which die is formed on its upper surface with a pattern of convex portions necessary for the formation of a pattern of concave portions on the mask. The pattern of convex portions may be formed on the die by any suitable means such as etching or evaporation techniques. Using this die, the exposure mask 100 is produced by injection molding a transparent material or letting inflaw of the transparent material into the die. Another expedient is that the transparent material is supplied to a die having no convex portions and a pattern of a metal foil is formed on the transparent material by an evaporation technique which metal foil pattern may be used as a light inhibiting material.

Figure 5:
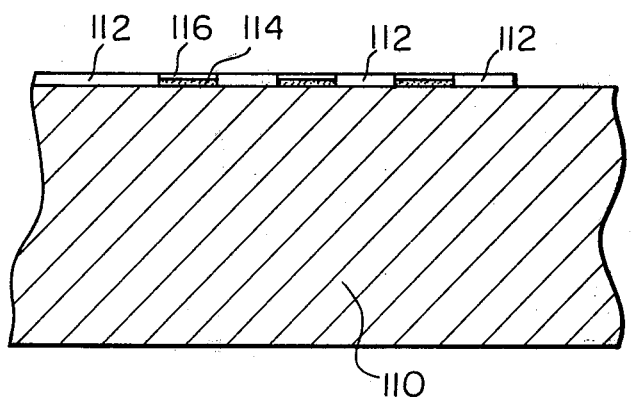
FIG. 5 is a fragmentary cross sectional view of a plastic substrate illustrating another example of a method of forming printed circuit leads on the plastic substrate.

FIG. 5 illustrates another example of a method of forming printed circuit leads on a plastic substrate forming part of a watch module construction. In FIG. 5, the substrate 110 is made of a platable grade resin and a mask 112 is placed on the substrate 110. The mask 112 is formed by painting an ink or stamping a foil on regions where the formation of printed circuit leads are undesired. Next, a desired pattern of printed circuit leads composed of a Ni layer 114 and an Au layer 116 is formed on unmasked regions of the substrate by an electroless plating technique. A detailed manufacturing process for the printed circuit leads will now be subsequently described in more detail.

The substrate 110 is made of a glass-fiber-reinforced polyethylene terephthalate resin which is used as the platable grade resin. A mask 112 is formed on the surface of the substrate 110 by an ink consisting of a polyvinyl chloride solution or an ink curable by an ultraviolet irradiation, or by a stamping foil made from a polyvinyl chloride solution to cover regions where the formation of the printed circuit leads is undesired. In this step, the masking ink is applied to the surface of the substrate 110 by printing or spraying, whereas the stamping foil is applied to the substrate by a hot stamping technique. Then, the plating step is applied onto the surface of the substrate in the following steps:

Degreasing→Roughening of
surface→Activating→Ni-electroless
plating→Au-electroless plating From the above plating process, it is possible to perform a selective plating for thereby forming a desired pattern of printed circuit leads each composed of a Ni layer 114 and an Au layer 116. No metal layer is formed on the surface of the substrate on regions masked by the mask 112 during the plating steps and, therefore, the formation of desired pattern of the printed circuit leads can be completed at one time and in the simplest way.

The adhesive strength of the electroless plating layer relative to the plastic substrate depends on the roughening step. In this example, the surface of the substrate 110 is roughened by immersion in 20% NaOH solution at a temperature of 70° C. for 10 to 15 minutes. The peeling test has been conducted for the printed circuit leads. The test has revealed that the adhesive strength is 0.4 Kg/cm.

Figure 6:
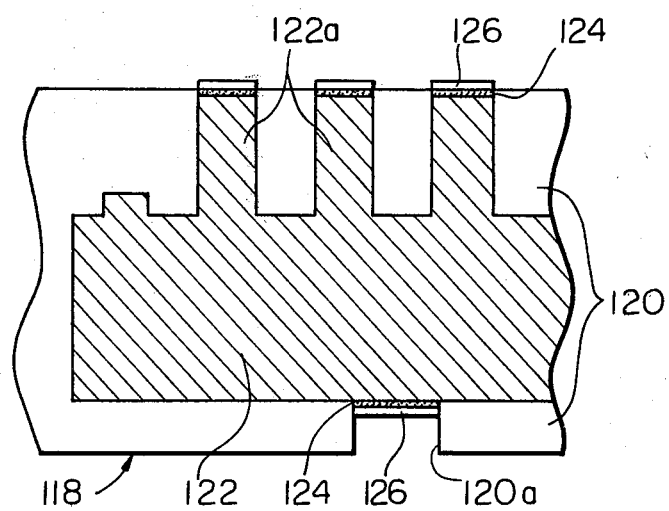
FIG. 6 is a cross sectional view of a modified plastic substrate illustrating still another example of a method of forming printed circuit leads on the substrate.

FIG. 6 shows another method of forming printed circuit leads on a plastic substrate. In this example, the substrate 118 is formed by a two-color injection molding a non-platable resin 120 and a platable grade resin 122. The platable grade resin 122 has a plurality of projections 122a having exposed surfaces in substantially alignment with the plane of surface of the substrate 118, the exposed surfaces being formed in the same pattern as that of printed circuit leads to be formed on the substrate 118. The non-platable resin 120 may have a pattern of cutouts 120a to expose desired regions of the platable grade resin 122 to form a pattern of printed circuit leads thereon. The printed circuit leads comprise a Ni layer 124 deposited on the platable grade resin 122, and an Au layer 126 deposited on the Ni layer 124, the Ni layer 124 and the Au layer 126 being formed by electroless plating. More specifically, the platable grade resin 122 consists of a glass-fiber-reinforced polyethylene terephthalate resin, and the non-platable resin 120 consists of a mixture of a polybutylene terephthalate resin, nylon-66 resin or a polyphenylene sulfide resin and lead chromate compound. The platable grade resin 122 and the non-platable resin 120 are formed by injection molding such that portions of the platable grade resin 122 are exposed in a desired pattern as previously noted. The substrate 118 thus formed is treated in the following steps:

Degreasing→Neutralizing→Roughening of
surface→Degreasing→Neutralizing→Activating-
→Electroless Ni plating→Electroless Au plating The above steps make it possible to perform a selective plating on a plastic substrate in a highly reliable manner. In this instance, the exposed surfaces of the platable resin 122 are formed with a plated layer of Ni layer 124 and Au layer 126 whereas no plated layer is formed on the surface of the non-platable resin and, thus, a substrate having a desired pattern of printed circuit leads shown in FIG. 6 is readily obtained.

While in the example of FIG. 6 the substrate 118 has been described as being formed by two color injection molding, it should be noted that the substrate 118 may be manufactured by initially forming the platable grade resin 122 by injection molding, roughening the surface of the platable resin 122, and injection molding a non-platable resin 120 so as to expose a desired pattern of regions of the platable resin 122 in a manner as shown in FIG. 6. The printed circuit leads are formed on the platable resin 122 in the similar manner as mentioned above and, therefore, a detailed description of the same is herein omitted.

Figure 7:
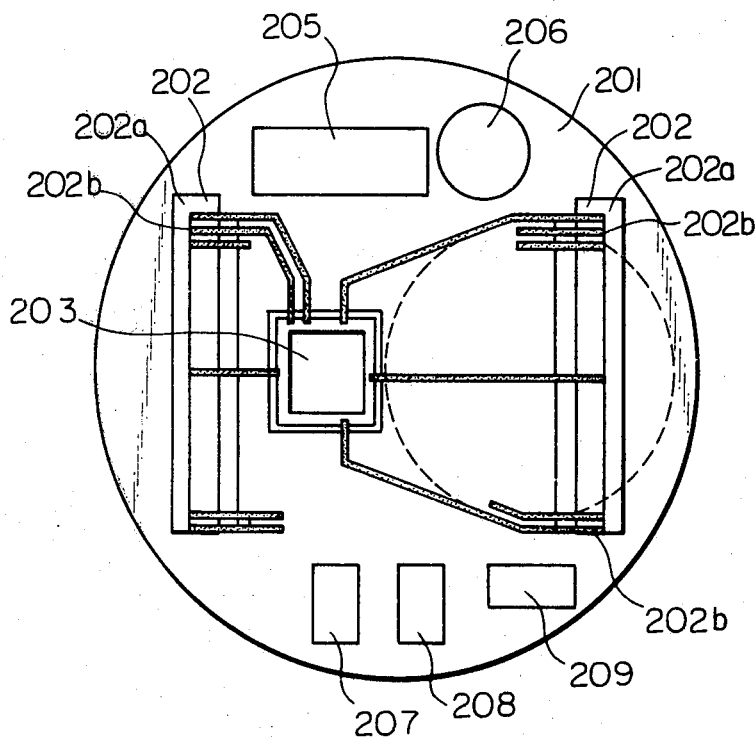
FIGS. 7 and 8 show another preferred embodiment of a solid state watch module construction according to the present invention.
Figure 8:
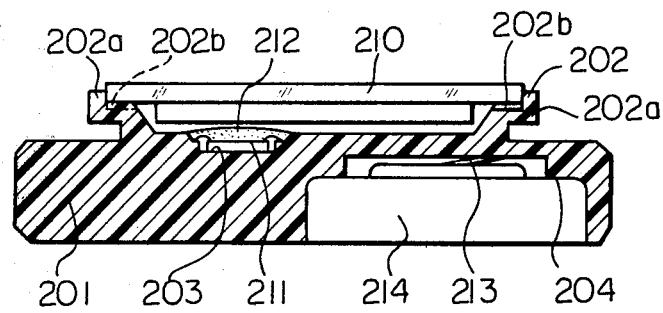

FIGS. 7 and 8 show another preferred embodiment of a watch module construction according to the present invention. A plastic substrate 201 is molded so as to integrate a display cell support portion 202 for directly supporting a display cell 210, an IC chip accommodating cavity 203 for mounting an IC chip 211, a battery accommodating cavity 204, a quartz crystal accommodating cutout 205 forme on one side of the substrate 201 for accommodating a quartz crystal oscillator, a trimming capacitor accommodating cutout 206 and cutouts 207, 208 and 209 for accommodating the other electrical components. Further, the cell support portion 202 has a positioning portion 202a for positioning the display cell 210, and rows of printed circuit leads 202b formed in vertical alignment with electric terminals of the display cell 210. Wiring patterns are formed on the surface of the substrate 201 in a manner as previously described. Reference numeral 211 denotes an IC chip, 212 a molded resin of an opaque material, 213 a battery connection spring disposed at the bottom of the accommodating cavity 204, and 214 designates a battery.

The procedure for assembling the above-described module construction for a digital electronic timepiece is as follows.

The required wiring patterns are formed on the surface of the molded plastic substrate 201 using such techniques as vacuum deposition, electroplating, printing, etching etc. These patterns are partially indicated by the heavy black lines in FIG. 7. The IC chip 211 is then mounted in the IC accommodating cavity 203 and connected to the printed circuit leads using techniques such as wire bonding, whereafter the IC chip is molded in place by the opaque resin 212. Next, spring members such as the battery connection spring 213 and a switch spring (not shown) are installed. Electrical components such as a quartz crystal oscillator, trimming capacitor and an input capacitor are mounted in the respective accommodating recesses 205, 206, 207, 208, 209. Lead electrodes for each element are connected to corresponding wiring patterns by soldering or by using an electrically conductive bonding agent. The module is completed by bonding and securing the display cell 210 to the cell support portion 202.

The display cell 210 is bonded in place by applying an electrically conductive bonding agent onto the surfaces of connection electrodes formed on the protruding portions of the electrode array which defines the terminal portion 202b of the cell support portion 202, and then by using the positioning portion 202a as a guide. This method thus electrically connects the electrode terminals of the display cell 210 to the connection electrode surfaces of the terminal portion 202b through the electrically conductive bonding agent, and firmly supports the display cell 210 on the plastic substrate 201 in a mechanical manner. Moreover, reliable cell connection is made possible since a slight dimentional error involved in the bonding of the display cell 210 is compensated for by adjusting the amount of electrically conductive bonding agent which is applied.

Figure 9A:
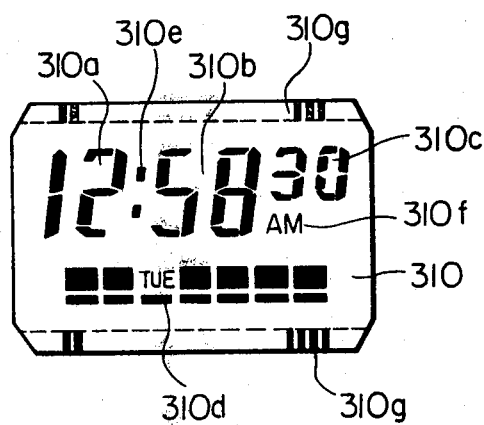
FIGS. 9A and 9B show an example of an electro-optical display device to be used for the watch module construction according to the present invention.
Figure 9B:
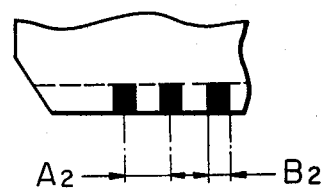

FIGS. 9A and 9B show an example of a display cell which comprises a liquid crystal display cell for a digital timepiece. In this example, the display cell has a plurality of digit electrodes and a plurality of segment electrodes arranged in a matrix array and is adapted to be driven in a dynamic scattering mode. In other words, the display cell 310 permits a normal display of hours, minutes, seconds, day of the week, and AM-PM through six display digits, namely an hours display portion 310a, minutes display portion 310b, seconds display portion 310c, day of the week display portion 310d, colon display 310e and AM-PM display portion 310f. A calendar display is selected by operating a display change-over button (not shown) which enables a months display in the hours display portion 310a and a data display in the minutes display portion 310b. Reference numeral 310g denotes rows of electric terminals formed on the bottom surface of display cell 310 on both sides. Although the electric terminals 310g are fixed to the corresponding printed circuit leads formed on the display cell support portion, it is difficult to perform the fixing operation and ensure its reliability in this case where the width and spacing of the electric terminals 310g and that of the arrayed printed circuit leads on the plastic substrate are too narrow. Moreover, difficulties are encountered in narrowly forming a large number of electric terminals even in terms of the techniques needed to form a wiring pattern and the electrode array over the recesses and projections of the plastic substrate.

It has been discovered on the basis of several experiments that 1 mm is the minimum preferable spacing between the arrayed electric terminals which allow the display cell 310 to be secured directly to the plastic substrate. The relationship between the number of electric terminals and the display cell driving system will now be described with reference to FIG. 9B.

FIG. 9B is a partial plan view of the electric terminals 310g shown in FIG. 9A and shows the width and spacing of the electric terminals in the case of the display cell structure shown in FIG. 9A. More specifically, if a display cell having approximately the same characteristics of the display cell 310 is provided with a cell structure for static drive, the number of electrodes for displaying numerals will be distributed along both sides of display cell 310 which commonly has a size of 24 mm × 17 mm, the spacing A2 between electric terminals is 0.8 mm and terminal width B1 is 0.4 mm. Since the previously mentioned 1 mm spacing between the terminals cannot be obtained, it is difficult to secure the display cell directly to the plastic substrate. By contrast, however, the number of electrodes for the matrix drive structure using three common electrodes and delivering the same performance is 16 to display numerals, 3 for day of the week display bars, 1 for all other display marks, and 3 electrodes to serve as common electrodes, giving a total of 23 or almost half the number required in the static drive structure. Accordingly, when arranging the electrical terminals along both sides of display cell 310, a terminal spacing A2 of 1.6 mm and a terminal width B2 of 0.8 mm can be obtained, as shown in FIG. 9B. This satisfies the conditions mentioned above so that the display cell can be directly secured to the plastic substrate and retained in a sufficiently reliable manner.

In other words, when a display cell is directly mounted to a plastic substrate, only minutes and hours can be displayed if the display cell possesses the static drive structure. However, adopting the display cell driven on the matrix driving method allows the mounting of a cell which is capable of delivering a full display.

In accordance with the invention as described above, a method of assembly is adopted in which elements such as an IC and a display cell are directly mounted on a molded plastic substrate which exhibits excellent dimensional precision. This allows the number of parts and assembly steps to be reduced in comparison with the conventional laminate structure. In other words, unlike the conventionally employed ceramic substrate which was known for its poor dimensional precision, a plastic substrate facilitates the formation of those portions which possess a complex shape but which require high precision, such as the electrode array of the cell support portion. This enables the production of a structure which permits direct bonding of the display cell. It is also possible to produce a shock resistant structure to prevent cracking of the display cell if the cell supporting portion is molded into a shock resistant shape as shown in FIG. 8. Further, the plastic substrate is advantageous in that leakage between electrodes can be avoided and workability during display cell bonding improved due to the uniformly wide gaps between the arrayed electrodes which is made possible by the integral molding method.

What is claimed is:

1. A watch module construction comprising:
    a single body of plastic material serving as a substrate and a baseplate, said single plastic body having formed on a first side thereof, a first cavity having a bottom and a second smaller cavity formed in the bottom of said first cavity with a stepped wall formed by said cavities on said first side of said single plastic body;
    a plurality of printed circuit leads directly formed on said stepped wall by a printing technique, and an integrated circuit chip directly mounted in said second cavity on said first side of said single plastic body, said integrated circuit chip having electrical terminals connected to said printed circuit leads and adapted to provide drive signals; and
    an electro-optical display means mounted in said first cavity in said first side of said single plastic body and having electrode patterns adapted to provide a display of characters on a viewing surface thereof, said display means having a plurality of electrical terminals connected to said electrode patterns, said electrical terminals of said display means being electrically connected to said printed circuit leads to provide an electrical connection therebetween whereby said display means receives said drive signals from said chip to provide a time indication by means of said electrode patterns;

said single plastic body having a cutout formed on the opposite second side thereof for receiving a battery, and serving as a back cover of a watch.

2. A watch module construction according to claim 1, in which said stepped wall is continuous with said bottom wall of said first cavity.

3. A watch module construction according to claim 2, in which said plurality of printed circuit leads comprise first printed circuit leads extending between said bottom wall of said first cavity and said stepped wall, and second printed circuit leads formed on said stepped wall and connected to said first printed circuit leads and said integrated circuit chip.

4. A watch module construction according to claim 1, further comprising a battery cathode plate mounted on a bottom wall of said cutout, and a cathode plate supporting column extending from said cathode plate through said plastic body and connected to one of said printed circuit leads, and a positive battery terminal extending through said plastic body and connected to another one of said printed circuit leads.

5. A watch module construction according to claim 1, in which said single plastic body has a display means supporting portion integrally formed therewith.

6. A watch module construction according to claim 5, in which said printed circuit leads terminate at their ends on said display means supporting portion in pectination.

7. A watch module construction according to claim 1, further comprising a battery cover held in place on said second side of said plastic body to protect said battery, and a front case rigidly mounted on said plastic body to cover said first side thereof.

8. A watch module construction according to claim 1, in which said printed circuit leads comprise leads formed by a photochemical process.

9. A watch module construction according to claim 1, further comprising an opaque material layer covering said integrated circuit chip and sealing it in said second cavity.

10. A watch module construction according to claim 1, further comprising an antenna plate provided in said single plastic body and an antenna supporting column extending from said antenna through said plastic body and electrically connected to one of said printed circuit leads to receive a time unit signal from said integrated circuit chip.

11. A watch module construction according to claim 1, in which said single plastic body is formed of a platable grade resin.

12. A watch module construction according to claim 1, in which said single plastic body comprises a platable grade resin and a non-platable resin covering said platable grade resin, said platable grade resin having a plurality of projections having their surfaces exposed in the same pattern as said printed circuit leads.

* * * * *